US008436625B2

(12) United States Patent
Sanderson et al.

(10) Patent No.: US 8,436,625 B2
(45) Date of Patent: May 7, 2013

(54) IDENTIFICATION OF POWER SYSTEM PRIMARY ARCS BASED ON PULSE DENSITY

(75) Inventors: John D. Sanderson, Portland, OR (US);
Forrest S. Seitz, Beaverton, OR (US);
Jack C. Talmadge, Ridgefield, WA (US)

(73) Assignee: Radar Engineers, Portland, OR (US)

( * ) Notice: Subject to any disclaimer, the term of this patent is extended or adjusted under 35 U.S.C. 154(b) by 396 days.

(21) Appl. No.: 12/554,695

(22) Filed: Sep. 4, 2009

(65) Prior Publication Data

US 2010/0060290 A1 Mar. 11, 2010

Related U.S. Application Data

(60) Provisional application No. 61/094,716, filed on Sep. 5, 2008.

(51) Int. Cl.
*G01R 29/26* (2006.01)
(52) U.S. Cl.
USPC .......................................................... 324/613
(58) Field of Classification Search .......... 324/512–536, 324/754.31, 538–556
See application file for complete search history.

(56) References Cited

U.S. PATENT DOCUMENTS

| | | | | |
|---|---|---|---|---|
| 3,746,930 A | * | 7/1973 | Van Best et al. | 361/86 |
| 4,605,819 A | * | 8/1986 | Warburton | 174/127 |
| 5,280,404 A | | 1/1994 | Ragsdale | |
| 5,657,244 A | * | 8/1997 | Seitz | 700/292 |
| 5,729,145 A | * | 3/1998 | Blades | 324/536 |
| 5,834,940 A | * | 11/1998 | Brooks et al. | 324/424 |
| 6,300,766 B1 | * | 10/2001 | Schmalz | 324/536 |
| 6,545,485 B1 | * | 4/2003 | Sanderson | 324/536 |
| 6,590,757 B2 | * | 7/2003 | Pahl et al. | 361/93.2 |
| 7,180,299 B2 | * | 2/2007 | Mernyk et al. | 324/509 |
| 7,259,568 B2 | | 8/2007 | Mernyk et al. | |
| 7,307,820 B2 | | 12/2007 | Henson et al. | |
| 2001/0033469 A1 | | 10/2001 | Macbeth et al. | |

OTHER PUBLICATIONS

Kim, et al., Arcing Fault Detection with Experimental Verification using Antenna for Signal Capture of Radiated Electromagnetic Energy, 10th Aging Aircraft Conference, 2007.*
Moving Average, available at http://en.wikipedia.org/wiki/Moving_average on Oct. 29, 2007.*
Microchip PIC24H Family Overview, 2005, downloaded Dec. 20, 2011 from http://ww1.microchip.com/downloads/en/DeviceDoc/70166A.pdf.*
Hi-Q124 Datasheet, available at http://web.archive.org/web/20060914060617/http://www.precisioninstrument.com/124datasheet.pdf on Sep. 14, 2006.*
Bulletin EU1234-H, What is Corona?, Hubbell Power Systems, Inc., 2004.*

* cited by examiner

*Primary Examiner* — Melissa Koval
*Assistant Examiner* — D. Miller
(74) *Attorney, Agent, or Firm* — Klarquist Sparkman, LLP

(57) ABSTRACT

A diagnostic instrument distinguishes primary arcs from other electrical discharges in an electric power system based on pulse time density of radio frequency noise caused by the discharges. The instrument counts a maximum number of noise pulses in any small time window over a period, and identifies the discharges as primary arcs if the pulse time density is in a range characteristics of primary arcs.

19 Claims, 5 Drawing Sheets

IDENTIFICATION OF POWER SYSTEM PRIMARY ARCS BASED ON PULSE DENSITY

CROSS REFERENCE TO RELATED APPLICATION

This application claims priority from U.S. Provisional Application No. 61/094,716, filed Sep. 5, 2008, which application is incorporated herein by reference.

BACKGROUND

Electrical discharges or arcs in the form of sparks and corona are present on virtually all electrical power distribution systems. Sparks can sometimes be seen as small bright flashes, while corona can sometimes be seen as a bluish glow around high voltage wires. They also create audible crackling or sizzling noise. Moreover, the discharges generate radio frequency (RF) noise that can be heard as static or buzzing on radio receivers, such as on HAM radio receivers.

Some sparks occur right on the primary and/or secondary conductors. These electrical discharges are herein called "primary arcs." Other sparks occur on hardware located on the same structure as the conductor, but are not connected to the conductor. These other discharges are herein termed "induced voltage sparks." These arcs are also known in the electrical power industry by various other terminologies. Primary arcs have high probability of leading to catastrophic equipment failure, whereas induced voltage sparks are primarily a concern for being a source of radio frequency (RF) interference while not necessarily being indicative of imminent equipment failure.

There are so many sparks on power lines and power poles that electric power utilities simply cannot fix all of them. In fact, most sparks are innocuous from a system reliability perspective. However, "primary arcs" usually carry current and are a warning sign of potential equipment failure. Being able to reliably and simply identify these discharges would permit a utility to better focus their repair efforts and more efficiently utilize available maintenance resources. Being able to distinguish from the RF or other noise detected by an RF receiver or other sensor whether the source is a primary arc or induced voltage sparks therefore is desirable.

SUMMARY

The following Detailed Description concerns techniques and instruments to distinguish primary arcs from other electrical discharges in an electrical power system. The techniques and instruments sense noise pulses in a received radio frequency or other sensor signal that are caused by power system electrical discharges. A measurement relating to time density of the noise pulses within a period of less than one or both halves of the power system cycle is calculated (e.g., occurrences per unit time in the time domain), and analyzed to determined whether the measurement is characteristic of primary arcs. In one illustrated implementation for example, a diagnostic instrument measures a maximum count of the noise pulses in any 100 μsec window over a period of 250 milliseconds, and identifies the discharges are primary arcs if this pulse time density measurement exceeds about 5 pulses per window.

This Summary is provided to introduce a selection of concepts in a simplified form that is further described below in the Detailed Description. This summary is not intended to identify key features or essential features of the claimed subject matter, nor is it intended to be used as an aid in determining the scope of the claimed subject matter. Additional features and advantages of the invention will be made apparent from the following detailed description of embodiments that proceeds with reference to the accompanying drawings.

DETAILED DESCRIPTION

Figure 1:
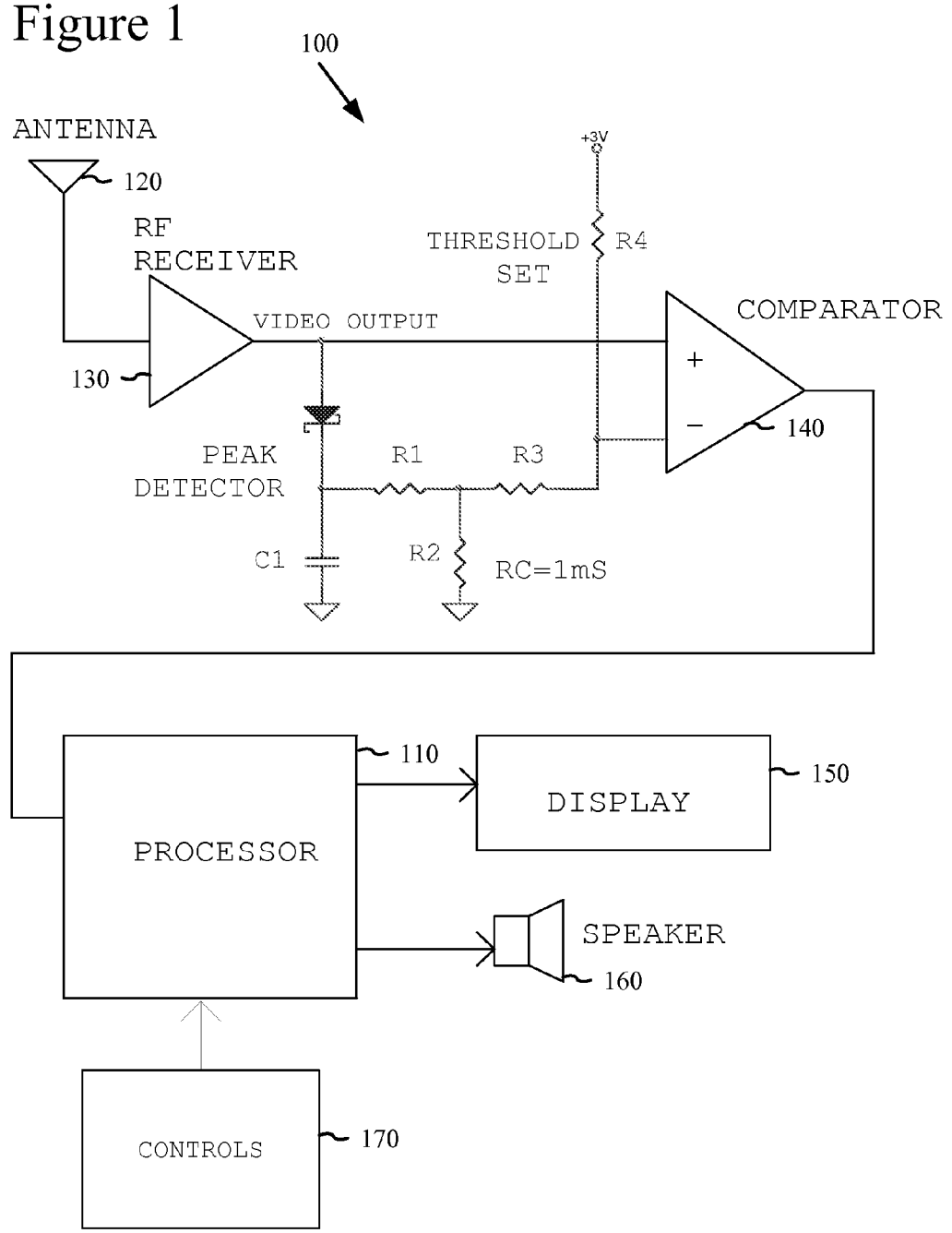
FIG. 1 is a circuit block diagram of a diagnostic instrument for distinguishing power system primary arcs from among other power line radio frequency interference sources.

The following detailed description concerns techniques and tools for distinguishing primary arcs from induced sparks on electric power lines and equipment. The described techniques characterize the source of power system sparks based on time density of electrical discharges within a half cycle of the alternating current electric power transmission. The technique is described with reference to its implementation in a particular power system diagnostic instrument. One example of the technique is housed in a diagnostic instrument that can be mounted in a vehicle, so as to allow a utility employee to patrol a geographic area of the electric system using the instrument to monitor for sparking or static activity and diagnose primary arcs. Alternatively, the diagnostic instrument can be a handheld, luggable or otherwise portable unit that the utility employee can carry in the field to locate and diagnose primary arc sparking. The example implementation of the technique is described in the context of a dedicated or specific purpose instrument, but alternatively can be implemented as a multi-purpose instrument or as one among many applications of general purpose hardware. Accordingly, it should be recognized that the techniques can be realized on a variety of different instruments or devices utilized for electrical power system diagnostics and maintenance.

Discharges on electric power systems exhibit a variety of characteristics. Typically, a discharge will occur when two pieces of metal on a powerline are separated by a small gap (e.g., 1 mm) and there is a voltage gradient between the metal parts (e.g., 1000+ V.). In a 60 Hz power system, there will typically be one or more discharges in each half cycle. Each such sparking source can be characterized in several ways. For example, by the number of discharges per half cycle, by the amplitude of the discharges, the location of the discharges on the phase, the spacing of the discharges, and the time density of the discharges, etc. The discharges radiate electromagnetic and other energy (e.g., acoustic). These characteristics can be observed from the noise produced by the discharge using a radio frequency receiver, acoustic pick-up, oscilloscope, or the like. Due to differences in gap distance, geometries and size of the metal parts, presence of electrical insulators, and etc., the discharge characteristics may vary significantly between individual spark sources on power lines. In many cases, both primary arcs and induced sparks exhibit these various characteristics. It has therefore been a challenge to discover characteristics of the discharges upon which to distinguish between primary arc and induced sparks.

According to one implementation of the technique described herein, an instrument distinguishes discharges from an electric power system source that are primary arcs and those that are induced sparks based on the characteristic of the time density of discharges within half of the alternating current cycle of the power system. In observations of power line sources that can be classified as primary arc and induced spark sources, we have observed that the sources classified to be primary arcs will have a high density of discharges on at least one half cycle, as compared to the sources classified as induced sparks. If, for example, it is detected that there are more than about 5 pulses in a 100 μsec window, it can be surmised that the spark under evaluation is located directly on the primary conductor: i.e., a primary arc. However, if the spark had, for example, only 5 pulses in a period of milliseconds, it would be identified as an induced spark.

We have further observed that corona type discharges also can produce discharges with a high time density. It can be useful to also distinguish primary arcs that are sparking discharges from such corona type discharges. We have observed that sparking primary arcs will tend to occur on both halves of the electric power system cycle, whereas corona discharges will tend to occur on only one half of the electric power system cycle. Thus, a further check whether a high density of pulses occur at intervals corresponding to one half cycle or both half cycles can be used to further distinguish power line sources that can be classified as primary arcs from those that are corona.

An exemplary embodiment of an instrument 100 that implements the primary arc detection technique is shown in FIG. 1. The instrument 100 includes a processing unit 110, such as a microprocessor or microcontroller, which is programmed in firmware to perform a process implementing the primary arc detection technique (discussed and illustrated in more detail below). The firmware can be stored in read-only memory (ROM) chip (not shown), on a hard drive or other storage in the instrument. Alternatively, the processing unit 100 can be a digital logic circuit, such as a programmable logic array, which is configured to perform the process implementing the primary arc detection technique.

The instrument further includes circuitry for sensing electrical discharges on a nearby powerline or other electric power system equipment. The instrument has an antenna 120 and radio frequency receiver 130. Alternatively, the instrument can be a sensor for other energy radiated from a sparking power line source, such as electrical current, acoustic, oscilloscope, video (base-band) receiver or near field probe, among others. The radio frequency receiver 130 provides a video signal output that is coupled to the non-inverting input of a comparator 140. The comparator 140 generates digital pulses for input to the microprocessor, which pulses correspond to the power system discharges. A network of resistors establishes a threshold for the comparator 140 based on two inputs: resistors R2, R3 and R4 set a minimum level, while resistors R1 and R2 set a fraction of the peak video level. A peak detector circuit formed by capacitor C1 and a diode senses the voltage peaks on the radio frequency receiver video output. This minimum threshold level and peak video level establish a threshold at which radio frequency noise on the radio frequency receiver's video signal output is sensed as an electrical discharge. The digital pulses from the comparator are input to the microprocessor for counting and analysis.

The instrument also has a display 150 and speaker 160, which are controlled by the microprocessor. The instrument presents the result of the primary arc identification process on the display 150, such as via a text indication identifying discharges as a primary arc. The display also may present other measurements of characteristics of the discharges, such as the measured pulse time density, peak levels, and etc., if desired. The instrument provides an audio output on the speaker 160 corresponding to the radio frequency noise received on the radio frequency receiver, so that the operator can monitor radio frequency activity. The instrument may also provide an audible indication or alert that a primary arc is detected as a result of the process.

The instrument also includes controls 170, such as buttons, switches, knobs or the like. With the controls 170, the operator of the instrument can select between variations or settings for the primary arc detection process, or control sensitivity of the detection process. For example, the illustrated embodiment of the instrument provides multiple variations of the primary arc detection process. The operator selects between these variations with a switch. This way the operator can control the instrument to selectively use more than one variation of the primary arc detection process to provide more than one basis for distinguishing that discharges are primary arcs.

Figure 2:
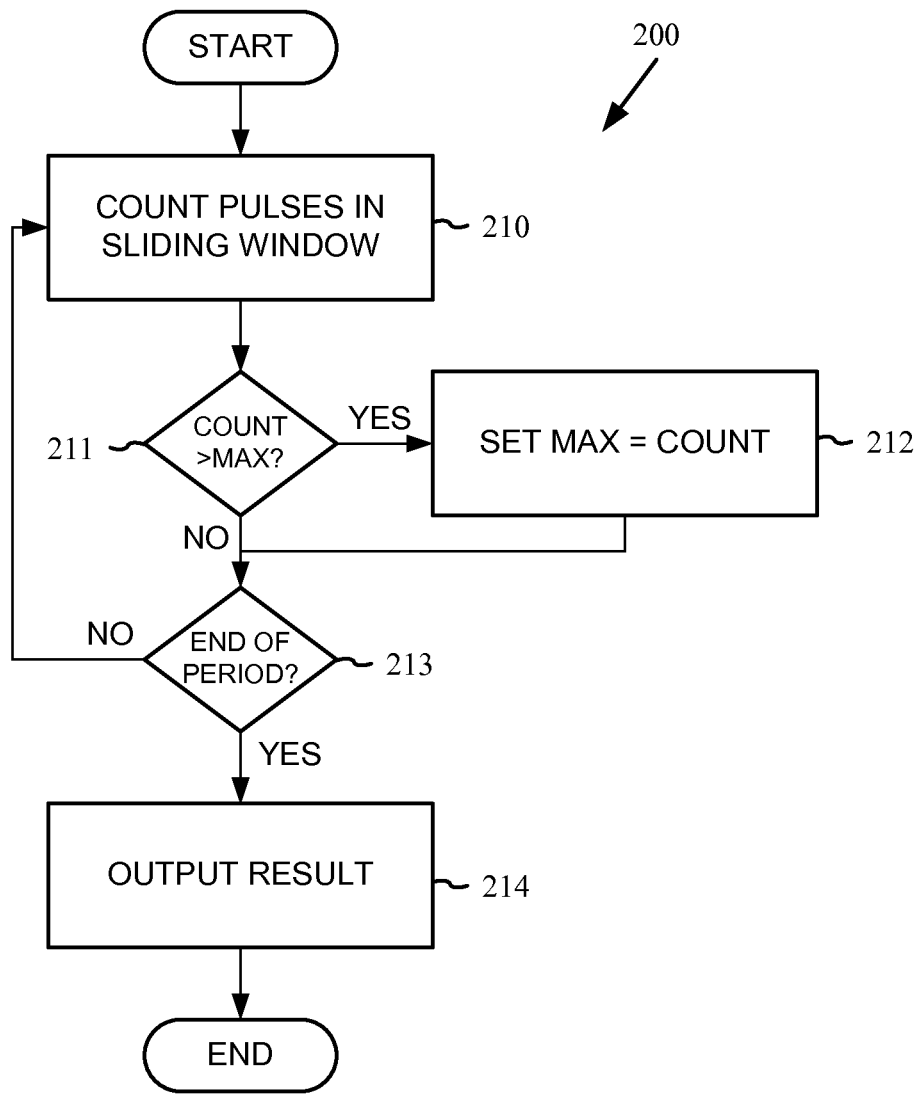
FIG. 2 is a flow diagram of an operating process performed by the apparatus in FIG. 1 to distinguish power system primary arcs from among other power line radio frequency interference sources.
Figure 3:
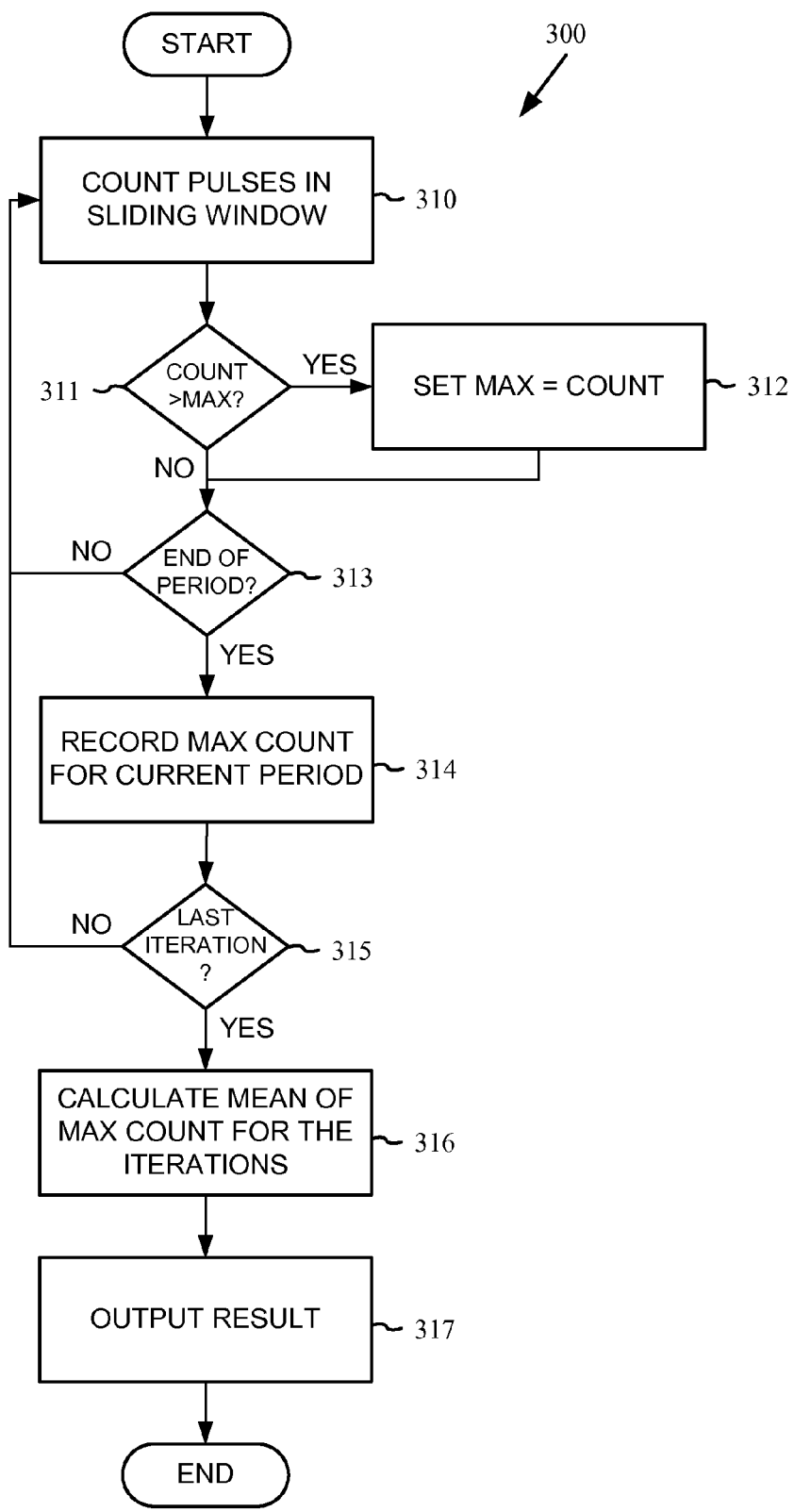
FIG. 3 is a flow diagram of an alternative operating process performed by the apparatus in FIG. 1 to distinguish power system primary arcs from among other power line radio frequency interference sources.

The instrument 100 implements processes 200, 300 shown in FIGS. 2 and 3 for distinguishing primary arcs from other electrical discharges in an electric power system based on pulse time density. The operator of the instrument can select between variations of the primary arc detection processes with a switch, among the instrument's controls 170. Alternative embodiments of the diagnostic instrument can implement fewer or more variations of the primary arc detection process.

A first variation of the primary arc detection process 200 determines the maximum number of pulses that occur in any 100 μsec window over a period of 250 milliseconds. As shown by action 210, the process counts pulses in each 100 μsec window. The 100 μsec windows can be non-overlapping consecutive windows, or alternatively the count can be made in an overlapping, sliding window manner. Then, the process 200 updates a maximum count variable to equal the current window's count, if the current window's count exceeds the previous maximum count as shown by actions 211, 212. As shown by the decision 213, the process 200 repeats this loop of steps 210-213 for the period of 250 milliseconds. At the end of this period, the maximum count variable will equal the maximum count in any 100 μsec window over the 250 milliseconds period. The duration of the window, the count threshold and period are parameters that can be varied for alternative implementations of the process 200.

The process 200 outputs a result on the instrument's display 150 based on the determined maximum pulse count. Variations of the instrument can display the result in a variety of formats, such as a digital value or graphically (e.g., a bar or the like). The instrument can display the raw maximum pulse count value for the result of the process, which is related to a measurement of the pulse time density. Alternatively, the instrument can scale or otherwise convert the raw pulse count to a calculated pulse time density, such as by dividing the pulse count by the window duration. Further, in some implementations of the process, the instrument can further compare the maximum pulse count result to a range or threshold characteristic of primary arcs, and output a determination or indication whether a primary arc has been detected based on the comparison. In an exemplary embodiment, the instrument determines that a primary arc is present if the maximum pulse count in any window over the period exceeds 5. However, alternative implementations can use a different count threshold or range for the primary arc detection.

FIG. 3 illustrates a second variation of the primary arc detection process 300. The second variation process 300 again determines a maximum pulse count in any window over a predetermined period, using actions 310-313 similar to action 210-213 of the first variation process 200. In one implementation, the process 300 uses a window of 400 μsec and period of 16.7 milliseconds. However, different durations of the window and period can be chosen in alternative implementations. As illustrated by actions 314-315, the process 300 repeats and records the maximum pulse counts multiple times. In one implementation, the process 300 performs 10 iterations of the maximum pulse count determination, but alternatively a different number of repeated iterations can be used.

At action 316, the process 300 then calculates the mean maximum pulse count for the multiple iterations. Alternatively, the process may calculate another statistical combination of the recorded maximum pulse counts, such as the mode. At action 317, the process 300 outputs a result for the primary arc detection on the display 150 based on the mean maximum pulse count. Similar to the first variation process 200, the second variation process 300 can output the result as the raw mean maximum pulse count, a pulse time density value calculated based on the raw mean maximum pulse count, or an indication whether a primary arc is present based on comparison of the mean maximum pulse count to a threshold or range characteristic of primary arcs (as opposed to induced current discharges).

Other variations of the primary arc detection process alternatively can be implemented by the diagnostic instrument. For example, the instrument can determine measurements of the pulse time density of electric system discharges by sampling pulse counts over various different lengths of time. The instrument then displays the determination based on pulse time density that results from the variation of the process on its display.

Figure 4:
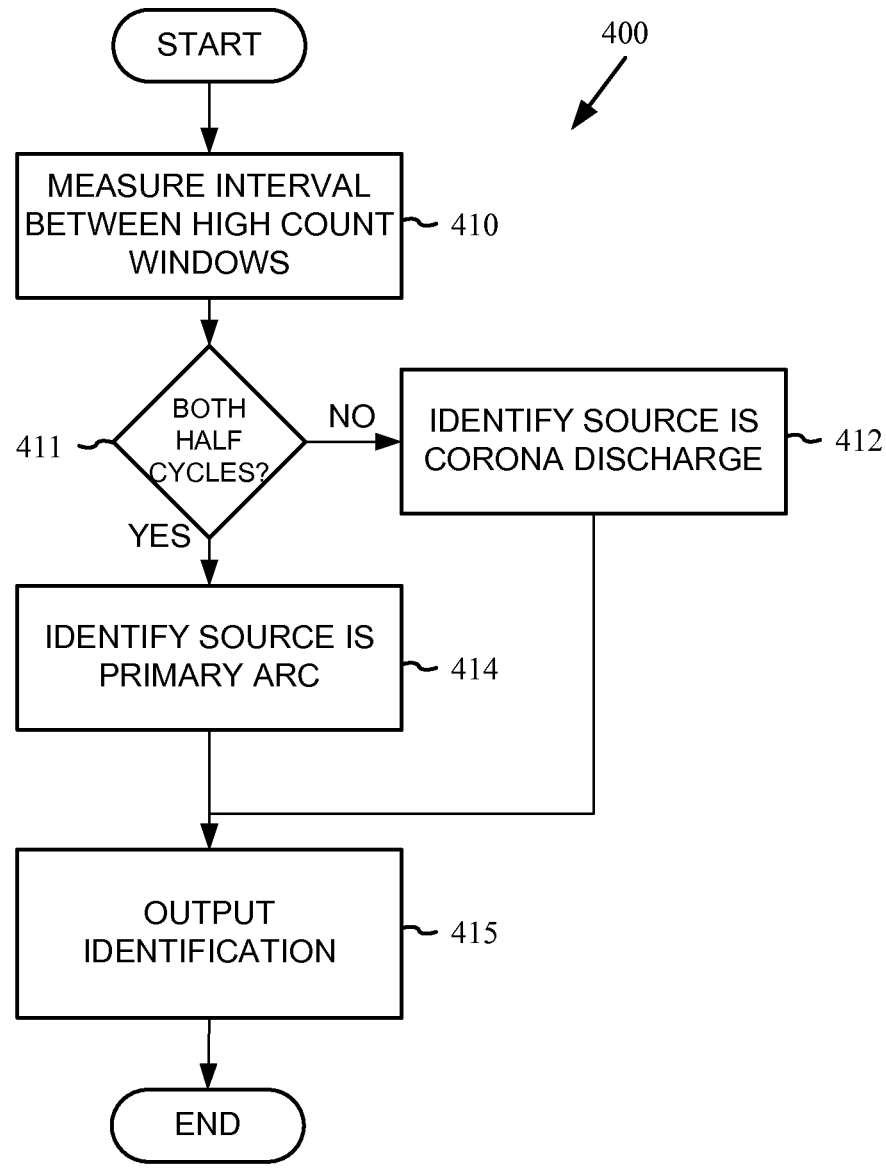
FIG. 4 is a flow diagram of an extension to the operating process of FIG. 2 or FIG. 3 to further distinguish sparking primary arcs from corona.

With reference to FIG. 4, either of the above operating processes 200, 300 can be extended for further distinguishing sparking primary arcs from corona type discharges. The extension 400 of the operating process measures an interval between the windows having high pulse counts that exceed a given threshold (e.g., a threshold of 5 pulse counts) as shown in action 410. As indicated by decision block 411 and action 412, if the interval between high pulse count windows is longer than the period between halves of the electric power system cycle, then the extended process classifies the discharges as corona. Otherwise, if the high pulse count windows occur at intervals of about twice per electric power system cycle, then the extended process classifies the discharges as primary arcs at action 414. With a 60 Hz electric power system, for example, high pulse count windows occurring on both halves of the cycle correspond to an interval of approximately 8.3 msec, whereas the interval between high pulse counts occurring on only one half the cycle is approximately 16.7 msec. If over-lapping windows are used, a high pulse count can occur in a cluster of neighboring windows within a same half of the electric power system cycle. Accordingly, for such overlapping window implementations, the extended process identifies a first high pulse count window out of a cluster of neighboring high pulse count windows, and measures the interval separating the respective initial window of clusters of overlapping high pulse count windows. Further, because the onset of primary arc discharges may vary between half cycles, a threshold of somewhat larger than the period between half cycles (e.g., 9 or 10 msec.) can be used to determine if the interval between high pulse count windows corresponds to fewer than both halves of the electric power system cycle. Finally, the extended operating process outputs the result identifying whether the discharges are characterized as corona or primary arcs.

Figure 5:
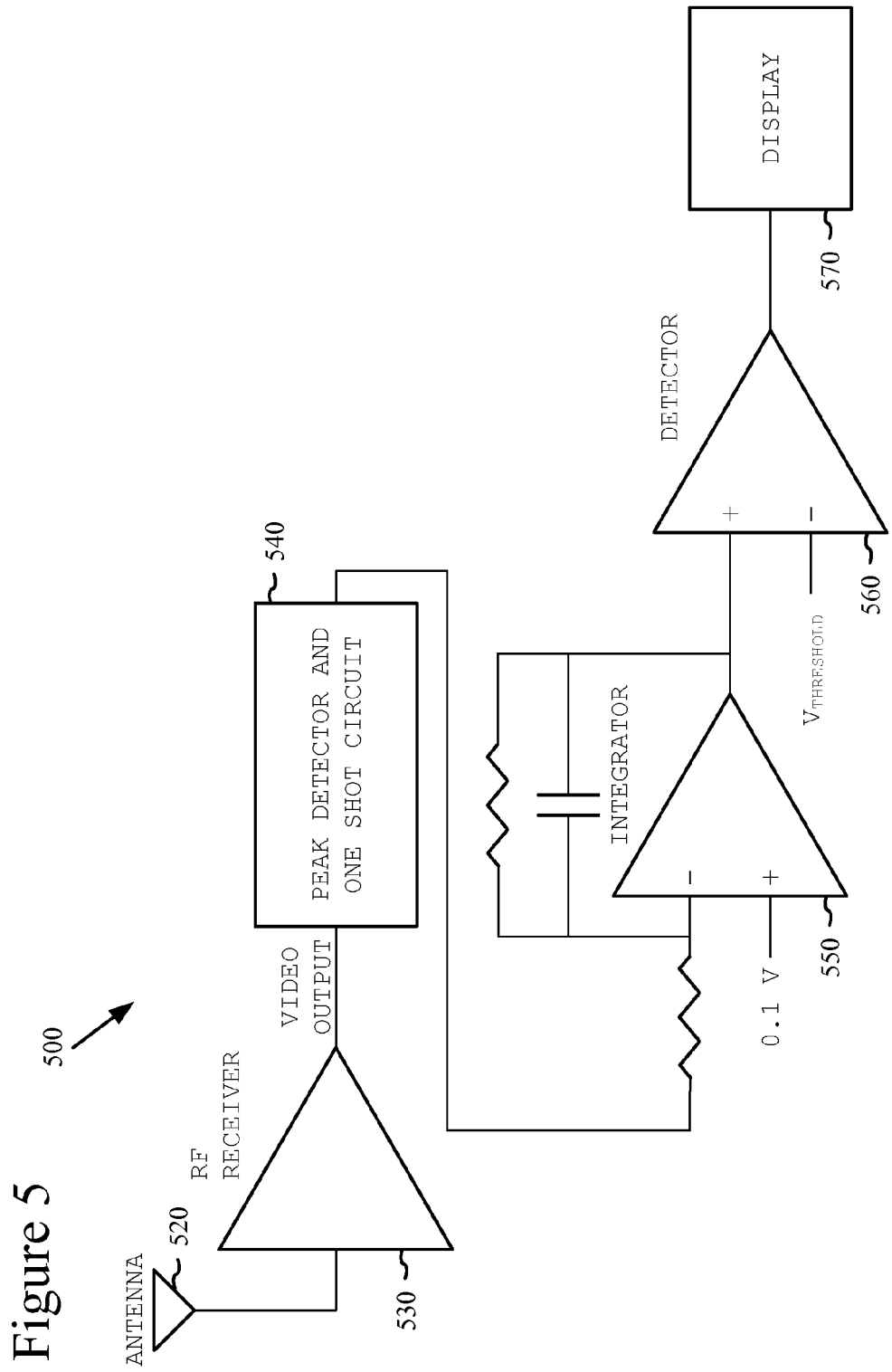
FIG. 5 is a circuit block diagram of an alternative implementation of a diagnostic instrument for distinguishing system primary arcs.

FIG. 5 illustrates an alternative implementation of an instrument 500 implementing the primary arc detection technique. In this alternative implementation, the primary arc detection process is implemented in hardware circuitry, rather than in digital logic or programming of a microprocessor. This alternative implementation instrument 500 also includes an antenna 520 and RF receiver 530 for sensing electromagnetic energy radiated from a sparking power line source. The RF receiver's video output is provided to a peak detector and one-shot circuit 540. The circuit 540 produces a pulse with a uniform width (e.g., 2 μsec) when spark noise from an electrical discharge is sensed in the RF receiver's video output.

The instrument 500 includes an integrator 550 and primary arc detector circuit 560. The integrator 550 can be an analog or digital integrator circuit. In the case of an analog circuit, the integrator produces a voltage signal whose level is related to the time density of noise pulses. The output voltage of the analog integrator increases as the pulses are more closely spaced. For integrating pulses within a window less than one electric power system cycle, a bleed resistor can be connected in parallel with the capacitor of the analog integrator. The resistance of the bleed resistor is chosen such that the analog integrator has a time constant less the duration of the electric power system cycle. For example, a time constant for the analog integrator of 2 msec. will ensure the voltage output of the analog integrator returns to zero in less than one half of the electric power system cycle. As a further alternative, a low pass filter with a long time constant can be used to perform the function of the integrator 550 in the instrument 500. Alternatively, the integrator 550 can be a digital integrator that produces a digital value relating to a number of noise pulses occurring within a time window or windows equal to or less than a half cycle of the electrical power system. The primary arc detector circuit 560 then compares the integrator circuit output to a threshold or range characteristic of primary arcs. For example, the primary arc detector circuit 560 used with an analog integrator 550 can be a voltage comparator that produces an output signal when the integrator output voltage exceeds a threshold voltage. The primary arc detector circuit drives a display 570, such as an indicator LED or other display.

In view of the many possible embodiments to which the principles of our invention may be applied, we claim as our invention all such embodiments as may come within the scope and spirit of the following claims and equivalents thereto.

We claim:

1. A method of detecting primary arcs on an electric power system, the method comprising:
    receiving, using an antenna, a radio frequency sensor signal generated by overhead power transmission or distribution lines;
    analyzing the sensor signal to detect noise pulses within the sensor signal produced by any nearby electrical discharge, the noise pulses comprising noise pulses caused by primary arcs and noise pulses caused by induced sparks, wherein primary arcs comprise electrical discharges occurring on a primary conductor or a secondary conductor, and wherein induced sparks comprise electrical discharges occurring on a structure that is physically common to, but electrically decoupled from, the primary conductor and the secondary conductor;

counting the noise pulses for at least one time duration, wherein each said duration is less than one half cycle of the electric power system, and wherein said counting comprises counting noise pulses in a plurality of windows over a period of time;

determining a measurement related to noise pulse density based on said counting, the measurement distinguishing primary arcs from induced sparks in the overhead power transmission or distribution lines, wherein said determining comprises determining a maximum of the counts of noise pulses in any of the windows over the period of time;

repeating a plurality of iterations of said counting noise pulses in a plurality of windows over a period of time, wherein said determining comprises determining a statistical measure of the maximum of the counts of noise pulses in any of the windows over the period of time for the plural iterations;

determining whether the measurement is in a range characteristic of primary arcs or in a range characteristic of induced sparks; and producing an output result based on the measurement, wherein producing an output comprises displaying an indication that a primary arc is detected when the measurement is determined to be in the range characteristic of primary arcs.

2. The method of claim 1, wherein said counting uses consecutive non-overlapping windows.

3. The method of claim 1, wherein said counting uses overlapping sliding windows.

4. The method of claim 1, wherein said statistical measure is a mean of the maximum of the counts of noise pulses for the plural iterations.

5. The method of claim 1 for further distinguishing primary arcs from corona-type discharges, the method further comprising:

wherein said counting comprises counting noise pulses in a plurality of time windows over a period of time, the time windows having durations less than a half cycle of the electric power system;

measuring an interval between windows with high noise pulse counts;

determining whether said interval corresponds to high noise pulse counts occurring on both or fewer than both halves of an electric power system cycle;

producing an output indicating a primary arc when the high noise pulse counts are determined to occur at intervals corresponding to both halves of the electric power system cycle, and indicating the corona-type discharges when the high noise pulse counts are determined to occur at intervals fewer than both halves of the electric power system cycle.

6. A diagnostic instrument for distinguishing primary arcs from other electrical discharges in an electric power system, the diagnostic instrument comprising:

a receiver to receive, using an antenna, a radio frequency sensor signal generated by overhead power transmission or distribution lines;

a detection circuit to detect noise pulses within the sensor signal produced by any nearby electrical discharge, the noise pulses comprising noise pulses caused by primary arcs and noise pulses caused by induced sparks, wherein primary arcs comprise electrical discharges occurring on a primary conductor or a secondary conductor, and wherein induced sparks comprise electrical discharges occurring on a structure that is physically common to, but electrically decoupled from, the primary conductor and the secondary conductor;

a primary arc identification circuit configured for:

counting the noise pulses for at least one time duration, wherein each said duration is less than one half cycle of the electric power system, and wherein said counting comprises counting noise pulses in a plurality of windows over a period of time;

determining a measurement related to noise pulse density based on said counting, the measurement distinguishing primary arcs from induced sparks in the overhead power transmission or distribution lines, wherein said determining comprises determining a maximum of the counts of noise pulses in any of the windows over the period of time;

repeating a plurality of iterations of said counting noise pulses in a plurality of windows over a period of time, wherein said determining comprises determining a statistical measure of the maximum of the counts of noise pulses in any of the windows over the period of time for the plural iterations;

determining whether the measurement is in a range characteristic of primary arcs or in a range characteristic of induced sparks; and an output for indicating a result based on the measurement, wherein indicating a result comprises displaying an indication that a primary arc is detected when the measurement is determined to be in the range characteristic of primary arcs.

7. The diagnostic instrument of claim 6 wherein the primary arc identification circuit comprises:

an integrator circuit coupled to receive the sensed noise pulses from the detection circuit and producing a voltage output relating to noise pulse time density; and a primary arc detector circuit coupled to receive the voltage output of the integrator circuit and produce an output indicative of whether the noise pulse time density exceeds a threshold characteristic of primary arcs.

8. The diagnostic instrument of claim 6 wherein the primary arc identification circuit comprises a processing unit for determining the measurement related to noise pulse density.

9. The diagnostic instrument of claim 6 wherein the receiver is a radio frequency, acoustic or video base-band receiver.

10. The diagnostic instrument of claim 6 wherein the output is a display of the measurement.

11. The diagnostic instrument of claim 6 wherein the output is a speaker providing an audible indication of the presence of a primary arc when the measurement is determined to be in the range characteristic of primary arcs.

12. The diagnostic instrument of claim 6 wherein the other electrical discharges include induced sparks or corona-type discharges, both of which occur on an overhead power transmission system.

13. The diagnostic instrument of claim 12 wherein the plurality of windows are an overlapping sliding window type.

14. The diagnostic instrument of claim 12 wherein the plurality of windows are a non-overlapping consecutive window type.

15. The diagnostic instrument of claim 6 wherein the statistical measure is a mean.

16. The diagnostic instrument of claim 15 wherein the plurality of windows are an overlapping sliding window type.

17. The diagnostic instrument of claim 15 wherein the plurality of windows are a non-overlapping consecutive window type.

18. The diagnostic instrument of claim 15 wherein the primary arc identification circuit further operates to determine whether high densities of noise pulses occur in one or both halves of the electric power system cycle, and to distinguish primary arcs from corona based on said determination whether high densities of noise pulses occur in both halves of the electric power system cycle.

19. A diagnostic instrument for distinguishing primary arcs from other electrical discharges in an electric power system, the diagnostic instrument comprising:
- a receiver for receiving a signal;
- a detection circuit for sensing noise pulses on the signal caused by electrical discharges;
- a primary arc identification circuit operating to produce a measurement value relating to time density of the noise pulses in at least one time duration wherein each said time duration being less than one half cycle of the electric power system, and to determine whether the measurement value is in a range characteristic of primary arcs, as distinguished from other arc types different than primary arcs; and
- an output for indicating a primary arc detection result when the measurement value is determined to be in the range characteristic of primary arcs;
- wherein the measurement value is a mean over a plurality of iterations of a maximum count of the noise pulses in any of a plurality of windows over a period of time; and
- wherein the primary arc identification circuit further operates to determine whether high densities of noise pulses occur in one or both halves of the electric power system cycle, and to distinguish primary arcs from corona based on said determination whether high densities of noise pulses occur in both halves of the electric power system cycle.

* * * * *